United States Patent [19]
Habuka et al.

[11] Patent Number: 5,846,321
[45] Date of Patent: Dec. 8, 1998

[54] METHOD OF PRODUCING SINGLE CRYSTAL THIN FILM

[75] Inventors: Hitoshi Habuka, Maebashi; Masanori Mayusumi, Annaka, both of Japan

[73] Assignee: Shin-Etsu Handotai Co., Ltd., Tokyo, Japan

[21] Appl. No.: 654,921

[22] Filed: May 29, 1996

[30] Foreign Application Priority Data

May 29, 1995 [JP] Japan .................................. 7-129947

[51] Int. Cl.$^6$ .................................. C30B 25/14
[52] U.S. Cl. .............................. 117/102; 117/89; 117/93; 117/99; 117/105
[58] Field of Search .................................. 117/84, 88, 89, 117/90, 91, 94, 97, 102, 93, 99, 105; 438/770, 783, 784

[56] References Cited

U.S. PATENT DOCUMENTS

| 5,023,750 | 6/1991 | Hiragama | 361/313 |
| 5,030,319 | 7/1991 | Nishino et al. | 216/87 |
| 5,360,768 | 11/1994 | Ohmi et al. | 438/770 |
| 5,403,434 | 4/1995 | Moslehi | 156/643 |

FOREIGN PATENT DOCUMENTS

40522634 A 9/1993 Japan .

OTHER PUBLICATIONS

"Dichlorosilane Effects on Low–Temperature Selective Silicon Epitaxy", Lou et al, *Applied Physics Letters*, vol. 58, No. 1, Jan. 17, 1991, pp. 59–61.

"Low–Temperature Native Oxide Removal From Silicon Using Nitrogen Trifluoride Prior to Low–Temperature Silicon Epitaxy", Burns, *Applied Physics Letters*, vol. 53, No. 15, Oct. 10, 1988, pp. 1423–1425.

Extended Abstracts, vol. 91–1, pp. 573–574 Apte et al, "Low Temperature, in–situ native oxide removal using Anhydrous Hydrogen Fluoride" Spring Meeting, Washington DC –May 5–10, 1991.

*Primary Examiner*—Felisa Garrett
*Attorney, Agent, or Firm*—Nikaido, Marmelstein, Murray & Oram LLP

[57] ABSTRACT

A method of growing a single crystal thin film characterized by heating a silicon single crystal substrate placed in a reactor vessel, then while the temperature of the silicon single crystal substrate is 850° C. or below, introducing a mixed gas composed of hydrogen fluoride gas and hydrogen gas into the reactor vessel for removing a native oxide film on a main surface of the silicon single crystal substrate in an ambient of hydrogen gas; and thereafter, growing a single crystal thin film by a vapor phase epitaxy on said main surface free from the native oxide film at a temperature of 1,000° C. or below. With this method, both evaporation of a dopant caused by outdiffusion and autodoping can be suppressed with a substantial reduction of the processing time.

6 Claims, 3 Drawing Sheets

F I G. 1
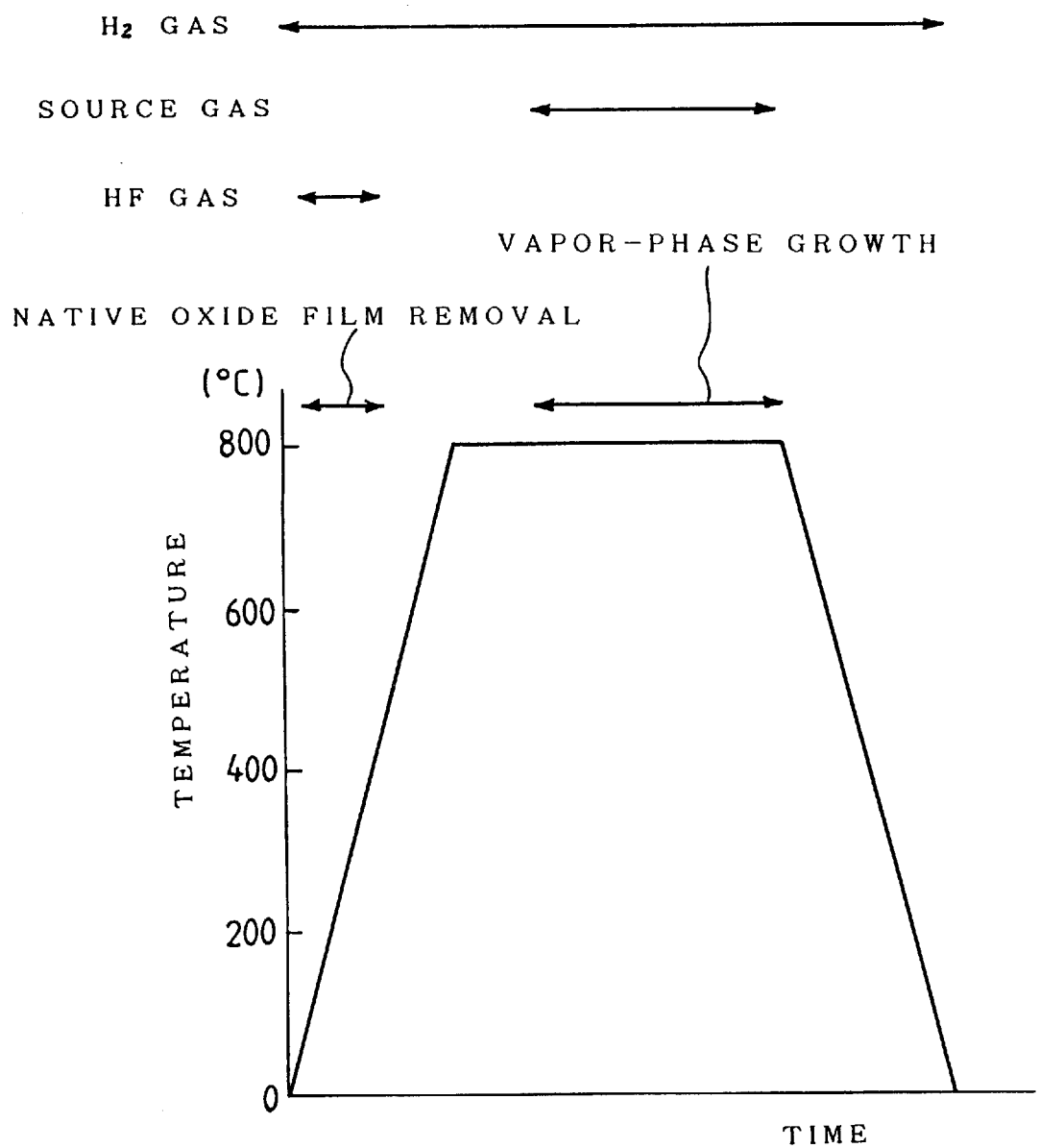

METHOD OF PRODUCING SINGLE CRYSTAL THIN FILM

BACKGROUND OF THE INVENTION

1. Field of the Invention

The present invention relates to a method of producing a single crystal thin film grown by a vapor phase epitaxy on a silicon single crystal substrate at a low temperature.

2. Description of the Related Art

In order to grow a single crystal thin film by a vapor phase epitaxy on a silicon single crystal substrate, a vapor-phase growth system or apparatus 10 such as shown in FIG. 5 is used. A silicon single crystal substrate W is mounted on a holder 16 rotatable around the axis of a rotating shaft 14 within a reactor vessel 12 of the vapor-phase growth apparatus 10. A heating means 18 is provided to heat the silicon single crystal substrate W at a desired temperature. A source gas is supplied from an inlet 20, then flows downstream over the silicon single crystal substrate W, and finally is exhausted from an outlet 22.

As shown in FIG. 4, it has been conventionally practiced to heat the silicon single crystal substrate W to a high temperature, such as 1,160° C., in an atmosphere of hydrogen ($H_2$) gas, subsequently hold at the same temperature for removing, by etching with hydrogen chloride (HCl), a native oxide film 24 consisting of silicon dioxide formed on a main surface of the silicon single crystal substrate W, and thereafter introduce a source gas over the main surface of the silicon single crystal substrate W at 1,100° C., for example, for growing a single crystal thin film on the main surface free from the oxide film.

A native oxide film 24 formed on the surface of a silicon single crystal substrate W by the effect of oxygen and moisture in air generally has a thickness of about 0.5 to 2 nm. In order to produce a single crystal thin film by a vapor phase epitaxy on a silicon single crystal substrate W while maintaining the crystallographic axis of the substrate W, the native oxide film 24 should be removed in advance.

According to the conventional process, however, when the native oxide film 24 is removed while the silicon single crystal substrate W is held at a high temperature above 1,100° C., a dopant such as boron is evaporated due to outdiffusion from the silicon single crystal substrate W resulting in that a layer of about 0.5 µm in thickness with a reduced dopant concentration is formed in the vicinity of the surface of the silicon single crystal substrate W.

Furthermore, since the surface of the silicon single crystal substrate W is also etched off when the native oxide film 24 is etched off by hydrogen chloride, a dopant, such as boron, incorporated in the substrate W is released into the vapor phase. Thus the released dopant and evaporated dopant due to outdiffusion are reincorporated into the single crystal thin film while growing by the vapor phase epitaxy, thereby causing autodoping.

As a diameter of a silicon single crystal becomes larger, a single-wafer process has found a widespread use in the vapor phase growth process. However, since the single-wafer production apparatus, as opposed to a batch processing type production apparatus, can process only one silicon single crystal substrate through a single cycle of operation. Therefore, a substantial reduction in the processing time of this apparatus is required to increase the throughput.

SUMMARY OF THE INVENTION

With the foregoing problems of the prior art, it is an object of the present invention to provide a method of producing a single crystal thin film with a reduction of dopant evaporation due to outdiffusion, autodoping and the processing time.

To achieve the object, a method of the present invention for producing a single crystal thin film comprises the steps of: heating a silicon single crystal substrate placed in a reactor vessel; then, while the temperature of the silicon single crystal substrate is 850° C. or below, introducing a mixed gas composed of hydrogen fluoride gas and hydrogen gas into the reactor vessel for removing a native oxide film on a main surface of the silicon single crystal substrate; and thereafter, growing a single crystal thin film by a vapor phase epitaxy on the main surface free from the native oxide film at a temperature of 1,000° C. or below.

It is preferable that the mixed gas is introduced into the reactor vessel while the temperature of the silicon single crystal substrate is raised. Further, the mixed gas is preferably introduced when the temperature of the silicon single crystal substrate is 100° C. or above.

In one preferred form of the invention, the heating of the silicon single crystal substrate begins at a temperature of 100° C. or below.

Preferably, the silicon single crystal substrate is placed in the reactor vessel while it is supported on its backside by a point contacted at more than three points or by an annular support.

The mixed gas is preferably prepared such that the hydrogen fluoride gas in the reactor vessel has a concentration in the range of 0.001 to 1.0 vol %.

The use of hydrogen fluoride gas ensures that at a temperature of 850° C. or below, a native oxide film of 0.5 to 2 nm in thickness formed on a surface of a silicon single crystal substrate can be removed within one minute. The heating temperature of the silicon single crystal substrate not exceeding 1,000° C. makes a result that a dopant such as boron is prevented from evaporating from a surface region of the substrate due to outdiffusion.

The hydrogen fluoride gas has no direct action to the surface of the silicon single crystal substrate but can only remove an oxide film on the surface of the substrate in a rapid manner. Accordingly, while the native oxide film is removed, the dopant such as boron is not evaporated from the substrate into the vapor phase, thereby the occurrence of the so-called autodoping is prevented. Since the hydrogen fluoride gas, when used in a reductive atmosphere of hydrogen gas, can prevent moisture from reacting with the surface of the substrate, the substrate can retain a smooth surface even after the native oxide film is removed.

For the concentration of hydrogen fluoride gas to be introduced into the reactor vessel, a very small value is appropriate. When the hydrogen fluoride gas concentration exceeds 1 vol %, hydrogen fluoride reacts slightly with silicon surface at higher than 850° C., resulting in very small roughness on the surface of the substrate. The hydrogen fluoride gas concentration less than 0.001 vol % is inadequate because it does not contribute to the progress in removing the oxide film.

The hydrogen fluoride gas is able to remove the native oxide film at low temperatures. Accordingly, if the hydrogen fluoride gas is effected to the native oxide film while increasing the temperature of the silicon single crystal substrate, it is possible to reduce or cut down the time for the process to remove the native oxide film.

The hydrogen fluoride gas can be used in the gaseous state when the temperature is not lower than its condensation temperature, i.e., 19.4° C. However, if it is effected to the silicon single crystal substrate at around room temperature, fluorine atoms remain on the surface of the substrate after the native oxide film is removed.

To solve this problem, the hydrogen fluoride gas is effected to the silicon single crystal substrate while being heated at a temperature of 100° C. or above in the hydrogen gas atmosphere. Fluorine atoms left on the surface of the substrate after the removal of the native oxide film react with thermally excited hydrogen molecules and separate from the substrate surface as hydrogen fluoride. The surface of the silicon single crystal substrate, now free from fluorine atoms, is terminated with hydrogen atoms.

Heating of the silicon single crystal substrate to raise the temperature should preferably be started at a temperature of 100° C. or below because $H_2O$ molecules which have adsorbed to the surface of the silicon single crystal substrate while stored in air still remain and can affect to the reaction of hydrogen fluoride and silicon dioxide, thereby accelerating the rate of native oxide film removal.

The above and other objects, features and advantages of the present invention will become manifest to those versed in the art upon making reference to the detailed description and the accompanying sheets of drawings.

BRIEF DESCRIPTION OF THE DRAWINGS

FIG. 1 is a process chart showing a process for producing a single crystal thin film according to Example 1 of the present invention;

DETAILED DESCRIPTION OF THE INVENTION

The present invention will be described below in greater detail with reference to the accompanying sheets of drawings and FIGS. 1 through 3, in particular.

Figure 3:
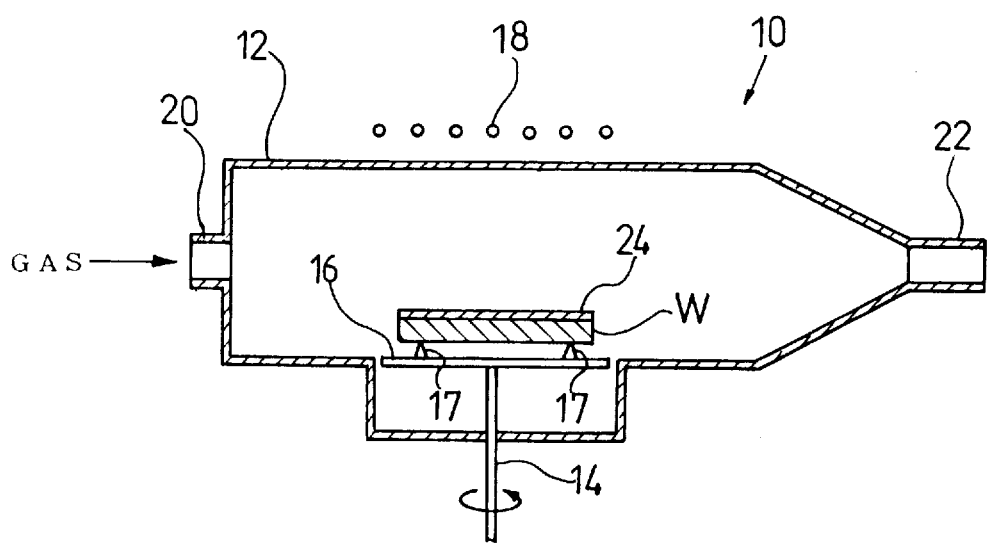
FIG. 3 is a diagrammatical cross-sectional view showing a vapor-phase growth system used for carrying out the process of the present invention.
Figure 4:
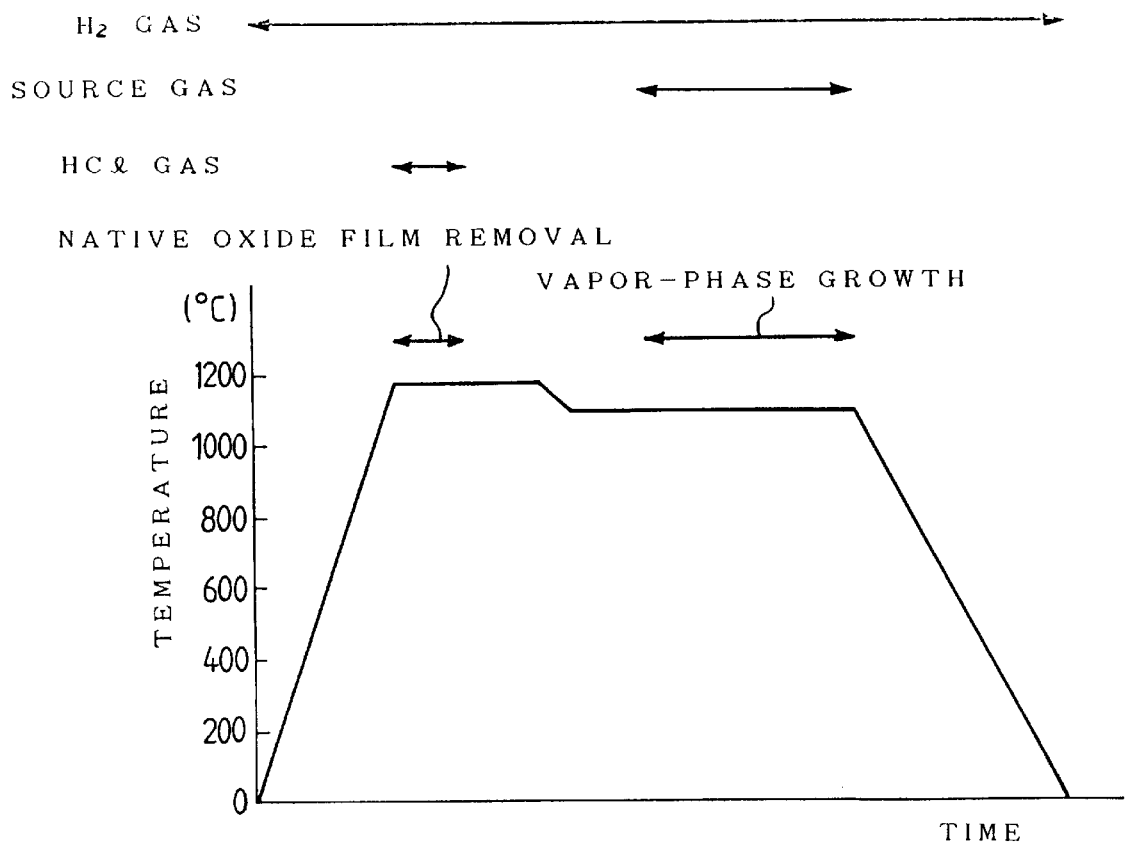
FIG. 4 is a process chart showing a conventional process for producing a single crystal thin film.
Figure 5:
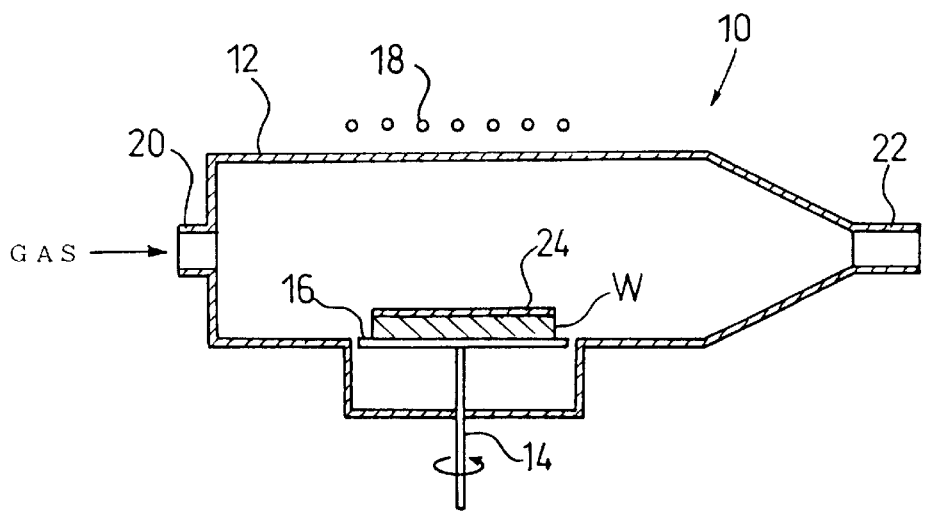
FIG. 5 is a diagrammatical cross-sectional view showing one example of the conventional vapor-phase growth systems.

FIG. 3 diagrammatically illustrates a vapor-phase growth system or apparatus 10 particularly suitable for use in a process for growing a single crystal thin layer or film by a vapor phase epitaxy on a silicon single crystal substrate W according to the present invention. It is to be noted that in FIG. 3 these parts which are identical or corresponding to those shown in FIG. 5 are designated by the same reference characters.

A silicon single crystal substrate W is mounted on a holder 16 via a substrate support 17. The holder 16 is rotatable around the central axis of a rotating shaft 14 in a reactor vessel 12 of the horizontal vapor phase growth system 10. A heating means 18 composed of a plurality of radiation heating lamps is arranged outside the reactor vessel 12 for heating the silicon single crystal substrate W to desired temperatures. A source gas is supplied from a gas inlet 20, then flows downstream over the silicon single crystal substrate W, and finally is exhausted from a gas outlet 22.

The substrate support 17 has a construction which is capable of holding the silicon single crystal substrate W by a point contact at more than three points. The substrate support 17 should no longer be limited to the illustrated embodiment but may include an annular substrate support or one having any other suitable shape and configuration. The substrate support 17 made of transparent quality glass has no capability to be heated by lamps. Since the silicon single crystal substrate W is the only object to be heated by the heating means 18, it is effective for reducing the processing time because of its high rate for cooling down.

The present invention will be further described below by way of the following experimental example achieved in the manner shown in FIGS. 1 and 2 for the production of a single crystal thin layer or film by the use of the vapor-phase growth system 10 described above.

EXAMPLE 1

A 200-mm-diameter, (100)-oriented, 0.015Ω·cm-resistivity, boron-doped silicon single crystal substrate W which had been stored in air at room temperature was mounted on the substrate support 17 in the reactor vessel 12 of the vapor-phase growth system 10.

Then, nitrogen gas was introduced from the gas inlet 20 into the reactor vessel 12 to replace the atmosphere in the reactor vessel 12.

The supply of the nitrogen gas to the reactor vessel 12 was stopped, and subsequently hydrogen gas was supplied from the gas inlet 20 into the reactor vessel 12 at a flow rate of 100 liter per minute, thereby replacing the atmosphere in the reactor vessel 12 with the hydrogen gas. The supply of the hydrogen gas was continued until a vapor-phase growth process completes, as shown in FIG. 1.

The silicon single crystal substrate W was heated up from a temperature about 25° C., and when the temperature of the silicon single crystal substrate W exceeded 100° C., a mixed gas consisting of hydrogen fluoride gas and the hydrogen gas was introduced into the reactor vessel 12 such that the mixed gas was prepared to have a hydrogen fluoride concentration of 0.5 vol % in the reactor vessel 12, thereby etching off a native oxide film 24 from a main surface of the silicon single crystal substrate W.

Figure 2:
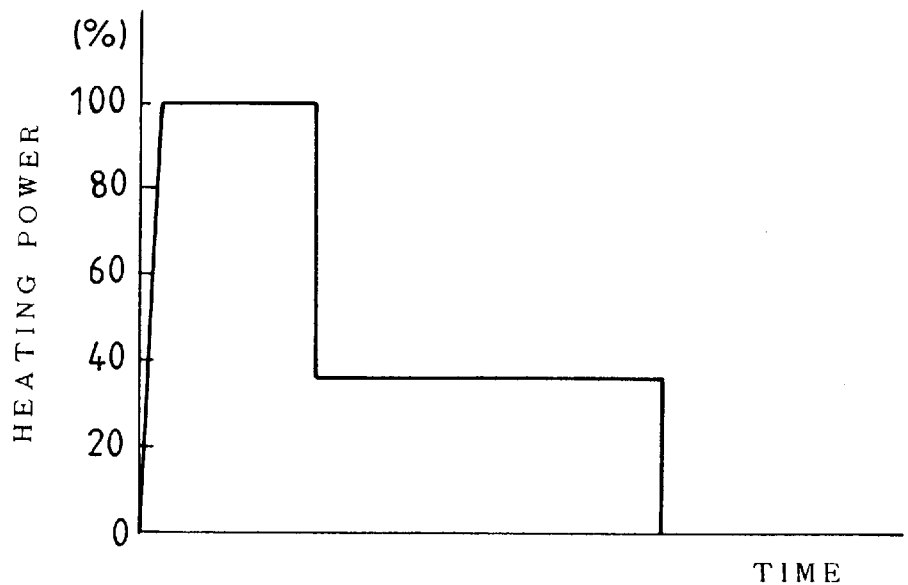
FIG. 2 is a graph showing the heating power generated during the process for producing the single crystal thin film according to Example 1.

As shown in FIG. 2, while the temperature was increased, the output power of the radiation lamps (heating apparatus) 18 was maintained at 100% to generate a greater heating power than as needed when a silicon single crystal thin film was grown. The introduction of the hydrogen fluoride gas to the reactor vessel 12 was stopped when 40 seconds passed after the heating power was first generated. Thereafter, the temperature of the silicon single crystal substrate W reached a desired temperature in the range of 800° to 1,000° C. whereupon the output power of the radiation lamps 18 was reduced.

When the temperature of the silicon single crystal substrate W was stabilized at the aforesaid desired temperature, a source gas of trichlorosilane was introduced from the gas inlet 20 into the reactor vessel 12 for 2 minutes, thereby forming an about 2-μm-thickness silicon single crystal thin film grown over the main surface of the silicon single crystal substrate W. Upon completion of this vapor-phase epitaxy process, heating by the radiation lamps 18 was stopped, causing immediate cooling-down of the silicon single crystal substrate W. About 2 minutes later, the temperature of the silicon single crystal substrate W went down below 100° C.

The silicon single crystal thin film grown on the silicon single crystal substrate W was evaluated for the resistivity distribution within wafer and depth-wise resistivity profile with the result that the effect of autodoping and evaporation of the dopant caused by outdiffusion was found to be quite small. Furthermore, evaluations taken with the use of the electron diffractometry and the X-ray diffractometry showed that the silicon thin film was a single crystal having, over its entire surface, the same crystal orientation as the silicon single crystal substrate W.

Comparative Examples 1–3

The proceeding of Example 1 was repeated with the difference that the ambient gas used for removing the native oxide film 24 by etching was changed from hydrogen gas to an inert gas, such as nitrogen (Comparative Example 1), argon (Comparative Example 2) or helium (Comparative Example 3). Experimental results uncovered that between the hydrogen gas and any one of the above-specified inert gases, no remarkable difference was found in terms of the rate for removing the native oxide film 24. However, in the case of the Comparative Examples 1–3 in which the silicon single crystal substrate W was treated by the hydrogen fluoride gas while being heated in an ambient of any one of the aforesaid inert gases, the treated silicon single crystal substrate W had a noticeable amount of very small roughness on its surface.

This phenomenon was probably caused by the following reasons. Actually, the hydrogen gas, nitrogen gas, argon gas and helium gas all contain a very small amount of moisture which has an effect of enhancing the corrosive properties of the hydrogen fluoride to thereby promote removal of the native oxide film. On the other hand, the moisture has a function to oxidize an active surface of the silicon single crystal substrate W which comes out or appears after the native oxide film is removed. In sum, moisture in the ambient gas oxidizes the surface of the silicon single crystal substrate W and thereby forms an oxide film, and at the same time, the hydrogen fluoride activated by the moisture removes the oxide film.

Since the nitrogen, argon and helium or the like inert gas is inert and hence cannot control or suppress the oxidative effect of the moisture even though the content of the moisture is very small. The hydrogen gas, as opposed to the inert gas, is a reductive gas and hence can control or suppress the oxidative effect of the very small amount of moisture mixed with the hydrogen gas to thereby maintain a reductive atmosphere. The hydrogen fluoride gas mixed with the hydrogen gas is therefore advantageous in removing the oxide film.

One embodiment of the present invention has been described above in conjunction with a method of removing a native oxide film achieved when a silicon single crystal thin film is grown. It is to be noted however that the native-oxide-film removing method can be effectively applied to the growth of a single crystal thin film composed of a material other than silicon.

As described above, according to the present invention, hydrogen fluoride gas is used in an ambient of hydrogen gas at a temperature of 850° C. or below to remove a native oxide film on a surface of a silicon single crystal substrate with the result that both evaporation of a dopant caused by outdiffusion and autodoping can be suppressed and the substrate can retain a smooth surface even after the native oxide film is removed. Since the native oxide film is removed while the temperature of a silicon single crystal substrate is raised, a substantial reduction of the processing time can be attained.

Obviously, various minor changes and modifications of the present invention are possible in the light of the above teaching. It is therefore to be understood that within the scope of appended claims the invention may be practiced otherwise than as specifically described.

What is claimed is:

1. A method of growing a single crystal thin film comprising the steps of:

(a) starting to heat a silicon single crystal substrate placed in a reactor vessel at a temperature of 100° C. or below;

(b) then, when the single crystal substrate is at a temperature of 100° C. or above, introducing a mixed gas consisting of hydrogen fluoride gas and hydrogen gas into the reactor vessel for removing a native oxide film on a main surface of the silicon single crystal substrate;

(c) stopping the introduction of hydrogen fluoride gas when the temperature of the silicon single crystal substrate is 850° C. or below during the step of heating up the single crystal substrate; and (d) thereafter, growing a single crystal thin film by a vapor phase epitaxy on said main surface free from the native oxide film at a temperature of 1,000° C. or below.

2. A method according to claim 1, wherein said silicon single crystal substrate is placed in the reactor vessel while it is supported on its backside by an annular support.

3. A method according to claim 2, wherein said mixed gas is prepared such that said hydrogen fluoride gas in the reactor vessel has a concentration in the range of 0.001 to 1.0 volume %.

4. A method according to claim 1, wherein said silicon single crystal substrate is placed in the reactor vessel while it is supported on its backside by a point contact at more than three points.

5. A method according to claim 4, wherein said mixed gas is prepared such that said hydrogen fluoride gas in the reactor vessel has a concentration in the range of 0.001 to 1.0 volume %.

6. A method according to claim 1, wherein said mixed gas is prepared such that said hydrogen fluoride gas in the reactor vessel has a concentration in the range of 0.001 to 1.0 volume %.

* * * * *